(12) United States Patent
Shiraki et al.

(10) Patent No.: US 8,871,835 B2
(45) Date of Patent: Oct. 28, 2014

(54) HEAT CONDUCTIVE ELASTOMER COMPOSITION

(75) Inventors: Masanori Shiraki, Aichi (JP); Noriaki Date, Aichi (JP); Yasujuki Agari, Aichi (JP)

(73) Assignee: Aronkasei Co., Ltd, Minato-ku, Tokyo (JP)

( * ) Notice: Subject to any disclaimer, the term of this patent is extended or adjusted under 35 U.S.C. 154(b) by 120 days.

(21) Appl. No.: 13/638,145

(22) PCT Filed: Oct. 12, 2010

(86) PCT No.: PCT/JP2010/067820
§ 371 (c)(1),
(2), (4) Date: Sep. 28, 2012

(87) PCT Pub. No.: WO2011/121826
PCT Pub. Date: Oct. 6, 2011

(65) Prior Publication Data
US 2013/0032752 A1   Feb. 7, 2013

(30) Foreign Application Priority Data
Mar. 29, 2010   (JP) ................................ 2010-075502

(51) Int. Cl.
  *C08K 9/06*   (2006.01)
  *C08L 91/06*   (2006.01)
  *C08L 53/02*   (2006.01)

(52) U.S. Cl.
  CPC .............. *C08L 91/06* (2013.01); *C08L 53/025* (2013.01)
  USPC ............ 523/206; 524/436; 524/437; 524/474

(58) Field of Classification Search
  CPC ................. C08K 2003/2227; C08K 2003/222; C08L 53/025; C08L 23/00
  USPC ............................ 523/206; 524/436, 437, 474
  See application file for complete search history.

(56) References Cited

U.S. PATENT DOCUMENTS

| | | | | |
|---|---|---|---|---|
| 6,106,011 | A * | 8/2000 | Masubuchi et al. | 280/743.1 |
| 2001/0018490 | A1 * | 8/2001 | Mashita et al. | 525/94 |
| 2004/0099987 | A1 * | 5/2004 | Imai et al. | 264/177.1 |
| 2004/0116571 | A1 * | 6/2004 | Su et al. | 524/404 |

FOREIGN PATENT DOCUMENTS

| | | | |
|---|---|---|---|
| JP | 2-141418 | A | 5/1990 |
| JP | 9-157543 | A | 6/1997 |
| JP | 1-158346 | A | 6/1999 |
| JP | 2000-169666 | A | 6/2000 |
| JP | 2001-106865 | A | 4/2001 |
| JP | 3176416 | B2 | 6/2001 |
| JP | 2007-302906 | A | 11/2007 |
| JP | 2008-127481 | A | 6/2008 |
| JP | 2008-130681 | A | 6/2008 |
| JP | 4119840 | B2 | 7/2008 |
| JP | 2008-291117 | A | 12/2008 |
| JP | 2009-209274 | A | 9/2009 |

OTHER PUBLICATIONS

International Search Report mailed Nov. 9, 2010 in connection with PCT International Application No. PCT/JP2010/067820, filed Oct. 22, 2010.

* cited by examiner

*Primary Examiner* — Peter Szekely
(74) *Attorney, Agent, or Firm* — Cooper & Dunham LLP

(57) ABSTRACT

The object of the present invention is to provide a heat conductive elastomer composite useful as the heat radiating member of electric parts or electronic parts, or the like. In the present invention, an aluminum hydroxide having a surface covered with an organic coupling agent and/or an inactivated magnesium oxide, being a magnesia clinker having a surface covered with an inorganic substance and/or an organic substance, is (are) combined as heat conductive filler(s) in an elastomer composite mainly composed of a styrenic elastomer.

4 Claims, No Drawings

HEAT CONDUCTIVE ELASTOMER COMPOSITION

FIELD OF THE INVENTION

The present invention relates to a heat conductive elastomer composite as a heat radiating member used in electric parts or electronic parts, or the like.

BACKGROUND OF THE INVENTION

For instance, electric or electronic parts such as power transistor, driver integrated circuit (IC) or the like used in central processing units (CPU) or the like, act as heat sources, and recently said parts tend to be closely assembled, so that the amount of heat generated from said parts is increased, making heat radiation safeguards more important.

As heat radiation safeguards for said heat source, at present, the heat radiating member is used as a spacer between said heat source and a cooling part such as heat radiating housing or the like, so as to improve the thermal conductivity from said heat source to said cooling part. To improve the heat conduction efficiency from said heat source to said cooling part, said heat radiating member should be made of a material having good adhesion to both said heat source and said cooling part.

Up to now, a composite made of a resin material in to which a heat conductive filler has been added and dispersed so as to give heat conductivity to said resin material, has been provided.

As said resin material, mainly a silicone rubber has been used. Said silicone rubber can adhere to both said heat source and said cooling part.

Nevertheless, said silicone rubber has a problem in that said silicone rubber produces a low molecular weight siloxane, which causes a bad contact in the electric circuit. To solve said problem, a counter measure to suppress the production of low molecular weight siloxane has been promoted, but a sufficient measure has never been provided.

Further, since said silicone rubber is a cross-linked rubber, said silicone rubber has no thermoplasticity, so that recycling of said silicone rubber may be impossible.

On the one hand, said heat conductive filler has two types, one being an electroconductive filler, and the other, an insulating filler. It has been known that said electroconductive filler includes a metal group filler, such as copper filler, nickel filler, or the like, a carbon group filler such as graphite filler, or the like, and it has been known that said insulating filler includes a metallic oxide filler such as magnesium oxide filler, alumina filler, or the like, and silica, as the heat conductive filler used in said heat radiating member, especially said insulating filler has generally been used.

Further, since said electric or electronic parts are heat sources, high incombustibility may be required of said heat radiating member used therein from a safety viewpoint. To give said heat radiating member, high incombustibility, a flame retardant is added to the material of said heat radiating member. Said flame retardant has two groups, one being a halogen group, and the other a non-halogen group.

It has been known that the halogen group includes brominated flame retardant, chlorinated flame retardant, or the like, and the non-halogen group includes a non-halogen phosphorous flame retardant such as phosphate, or the like, and a metal hydroxide such as magnesium hydroxide, aluminum hydroxide or the like. Recently from the viewpoint that stresses on the environment should be reduced, the non-halogen group flame retardant may be mostly used.

PRIOR ART

Patent Document

Patent Document 1: Tokkai 2001-106865
Patent Document 2: U.S. Pat. No. 3,176,416
Patent Document 3: U.S. Pat. No. 4,119,840
Patent Document 4: Tokkai 2007-302906
Patent Document 5: Tokkai 2008-127481

SUMMARY OF THE INVENTION

Problems to be Solved by the Invention

In Patent Document 1, magnesium oxide is used as a heat conductive filler. Nevertheless, magnesium oxide has a problem in that the magnesium oxide has a deliquescence property so that in a case where the magnesium oxide is kept at a high temperature and high humidity, said magnesium oxide will absorb humidity, causing the deterioration of the electrical isolation, heat radiating member, or the like.

In Patent Document 2, alumina is used as a heat conductive filler. Nevertheless, since alumina has a high hardness, making a problem in that the screw, mold, or the like, which are used to mix or mold said elastomer composite, will be worn away.

In Patent Document 3, tungsten powder is used as a filler. Nevertheless, tungsten is a transition metal having high electro-conductivity. Since the electro-insulation is required of a heat radiating member mounted in electric or electronic parts, metal group filler such as tungsten powder or the like can not be used as a filler.

In Patent Document 4, aluminum hydroxide, which is a metal hydroxide, is used as a flame retardant. Nevertheless, a large amount of metal hydroxide should be added so as to secure a high incombustibility, resulting in trouble due to the composite hardening and the moldability of the composite deteriorating.

In Patent Document 5, a phosphorous group flame retardant is used. Nevertheless, phosphorous group flame retardant has a poor humidity resistance and can become hydrolyzed under high humidity, resulting in trouble in that the change of color in the composite occurs, or the flame retardant bleeds out of the composite, or the molded composite.

Means to Solve Said Problems

As the means to solve said problems, the present invention provides a heat conductive elastomer composite comprising 100 volume parts of a mixture containing 100 parts by mass of a hydrogenated thermoplastic styrenic elastomer (E), 100 to 600 parts by mass of a softener for rubber having a kinematic viscosity of between 50 and 500 centistokes (cSt) at 40° C., and 1 to 100 parts by mass of an olefinic resin, with 40 to 400 volume parts of a covered aluminum hydroxide and/or a covered magnesium oxide as a heat conductive filler being added thereto, wherein said hydrogenated thermoplastic styrenic elastomer (E) is a hydrogenated product of block copolymer (Z) consisting of block unit(s) (S) of a polymer of styrenic monomer and block unit(s) (B) of a polymer of a conjugative diene compound, said elastomer (E) having a weight-average molecular weight in the range of between 150,000 and 500,000, and a styrenic monomer content in the range of between 20 and 50% by mass, said covered aluminum hydroxide being a aluminum hydroxide having a surface covered with an organic coupling agent, said covered magnesium oxide being a magnesia clinker having a surface covered with an inorganic substance and/or an organic substance, with said magnesia clinker being an inactivated magnesium oxide.

Said aluminum hydroxide and/or said magnesia clinker preferably have (has) a water-absorption rate by a humidity resistance test of below 1.5% by mass, and a new Mohs hardness, of below 10.

Further, the deflection temperature under load is preferably in the range of between 80 and 140° C.

Effect of the Invention

[Action]

Since said hydrogenated thermoplastic styrenic elastomer (E) is thermoplastic with a styrenic monomer content being in the range of between 20 and 50% by mass, the resulting elastomer composite can be recycled, and further, the resulting elastomer composite can adhere closely to both heat sources and cooling parts due to its flexibility. Further, since said elastomer (E) has a weight average molecular weight of 150,000 or higher, the resulting elastomer composite will have an excellent heat resisting property, while the weight average molecular weight of said elastomer (E) is set to be 500,000 or lower, so as to give said elastomer composite an excellent moldability.

Said softener for rubber is an ingredient which gives said elastomer composite flexibility, and improves adhesiveness to the heat source and the cooling part, but in a case where a softener having a kinematic viscosity of below 50 centistokes (cSt) at 40° C. is used, a remarkable amount of gas comes out during the molding of said elastomer composite, making said softener apt to bleed from the resulting molded article. Further, in a case where said softener has a kinematic viscosity of beyond 500 cSt, the resulting molded article will be remarkably sticky, and have an inferior workability.

Said olefinic resin is an ingredient which gives said elastomer composite a preferable hardness, rigidity and heat-resisting property, and for these purposes, it is preferable that said olefinic resin have a deflection temperature under load measured in accordance with JIS K 6921-2 in the range of between 80 and 140° C.

As the heat conductive filler used in the present invention, the aluminum hydroxide particle and/or magnesium oxide particle are selected. Aluminum hydroxide particles and magnesium oxide particles are both not so hard and they do not wear or damage the mixing machine and the molding machine.

Nevertheless, aluminum hydroxide particles and magnesium oxide particles do have moisture absorbency, so that in the present invention, in order to avoid moisture absorption, the surface of the aluminum hydroxide particles is covered with an organic coupling agent, and in the case of magnesium oxide, the surface of the magnesia clinker particles is covered with an inorganic substance and/or an organic substance. Said magnesia clinker is produced by the dead-burning of magnesite at a temperature of 1600° C. or higher for inactivation.

Said cover layer of said organic coupling agent does not easily come off from the surface of said aluminum hydroxide particles, and said cover layer of said inorganic substance and/or organic substance also does not easily come off from the surface of said magnesium oxide particles, both cover layers being water-resistant and long-lasting.

In a case where the moisture absorption rate of said aluminum hydroxide and magnesia clinker is below 1.5% by mass in a humidity resistance test, the moisture absorption will be small and deformation will be suppressed. In a case where the new Mohs hardness of the surface covering materials of said aluminum hydroxide and magnesium oxide is below 10, the abrasion of the mixing machine and the molding machine will surely be reduced.

[Effect]

The present invention provides a thermoplastic elastomer composite, having excellent heat resistance, good thermal conductivity, being flexible and adhesive to such objects as heat sources and cooling parts, further, having electrical insulating properties, good humidity resistance and durability, still further, not wearing screws and molds used for molding, and having excellent extrusion moldability.

Preferred Embodiment to Practice the Invention

The invention is precisely described as follows.

[Hydrogenated Thermoplastic Styrenic Elastomer]

The hydrogenated thermoplastic styrenic elastomer (E) used in the present invention is a block copolymer consisting of block unit(s) (S) of a polymer of a styrenic monomer (hereafter also described as polymer block unit(S)) and block unit(s) (B) of a polymer of conjugative diene compound (hereafter also described as polymer block unit (B)), and said polymer unit (B) mainly consisting of conjugative diene is wholly or partially hydrogenated.

Said polymer block unit (S) consisting of a styrenic monomer is a polymer block consisting of a styrenic monomer such as styrene, o-methyl styrene, p-methylstyrene, p-t (tertiary)-buthyl styrene, 1,3-dimethyl styrene, α-methyl styrene, vinyl naphtharene, vinylanthracene, or the like.

Said polymer block unit (B) consisting of a conjugative diene compound is a polymer block mainly consisting of a conjugative diene compound such as butadiene, isoprene, 1,3-pentadiene, or the like.

Said hydrogenated thermoplastic styrenic elastomer (E) used in the present invention is such as styrene-ethylene-butylene-styrene block copolymer (SEBS), styrene-ethylene-propylene-styrene block copolymer (SEPS), styrene-ethylene-ethylene-propylene-styrene block copolymer (SEEPS), or the like.

In the present invention, a especially useful hydrogenated thermoplastic styrenic elastomer (E) is a hydrogenated product of block copolymer (Z) having two or more polymer block units (S) and one or more polymer unit(s) (B), and particularly SEBS is a preferable hydrogenated thermoplastic styrenic elastomer (E) from the point of view of its heat resistance, wherein block copolymer (Z), having two polymer units (S) which combine respectively to both ends of one polymer block unit (B), is hydrogenated to change butadiene, which is constitution unit of said polymer block unit (B), to ethylene and butylene in SEBS.

Other elastomer or synthetic rubber may be added to said hydrogenated thermoplastic styrenic elastomer (E) in a small amount so far as the addition does not spoil the object of the present invention. Said elastomer or synthetic rubber is such as styrene-butadiene rubber (SBR), acrylonitrile-butadiene rubber (NBR), pyridine-butadiene rubber, styrene-isoprene rubber (SIR), styrene-ethylene copolymer, polystyrene-polybutadiene-polystyrene (SBS), polystyrene-polyisoprene-polystyrene (SIS), poly (α-methylstyrene)-polybutadiene-poly (α-methylstyrene) (α-MeSBα-MeS), poly(α-methylstyrene)-polyisoprene-poly (α-methylstyrene), ethylene-propylene copolymer (EP), styrene-chloroprene rubber (SCR), styrene-butadiene-styrene (SBS) copolymer, styrene-isoprene-styrene (SIS) copolymer, or the like.

In the present invention, said hydrogenated thermoplastic styrenic elastomer (E) having a weight-average molecular weight in the range of between 150,000 and 500,000 is used. In a case where said hydrogenated thermoplastic styrenic elastomer (E) having a weight-average molecular weight of less than 150,000 is used, the resulting elastomer composite will have a poor heat-resistance, and be apt to cause thermal deformation, and further said hydrogenated thermoplastic styrenic elastomer (E) will also have a poor retentivity of the softener, so that the softener will be apt to bleed from the resulting elastomer composite, making said composite sticky. On the other hand, in a case where said hydrogenated thermoplastic styrenic elastomer (E) having a weight-average molecular weight beyond 500,000 is used, the moldability of the resulting elastomer composite will deteriorate since the fluidity of the melted elastomer composite has dropped, and further the rubber elasticity of said elastomer composite will also weaken.

Still further, in the present invention, said hydrogenated thermoplastic styrenic elastomer (E) having a styrenic content in the range of between 20 and 50% by mass is used. In a case where said hydrogenated thermoplastic styrenic elastomer (E) has a styrene content of below 20% by mass, said hydrogenated thermoplastic styrenic elastomer (E) will have poor heat resistance, and the resulting elastomer composite may deform in a long term heat resistance test. On the other hand, in a case where said hydrogenated thermoplastic styrenic elastomer (E) has a styrene content of beyond 50% by mass, the rubber elasticity of the resulting elastomer composite will degrade and said elastomer composite will have poor adherence to both the heat source and the cooling part. Said hydrogenated thermoplastic styrenic elastomer (E) is constituted by said block unit (B), and it is preferable that the 1,2-vinyl bond content contained in said block unit (B), consisting of a conjugative diene compound, be below 50% by mass. In a case where the 1,2-vinyl bond content is below 50% by mass, the resulting elastomer composite will be less sticky.

The weight average molecular weight (Mw) of said hydrogenated thermoplastic styrenic elastomer (E) is measured by the gel permeation chromatography (GPC) method.

[Polystyrene Conversion Molecular Weight Measurement by GPC (Gel Permeation Chromatography).]

Measuring condition
a) Measuring instrument: SIC Autosampler Model 09
   Sugai U-620 COLUMN HEATER
   Uniflows UF-3005S2B2
b) Detector: MILLIPORE Waters 410
   Differential Refractometer
c) Column: Shodex KF806M×2
d) Oven temperature: 40° C.
e) Elution solvent: Tetrahydrofuran (THF) 1.0 ml/min.
f) Standard sample: Polystyrene
g) Injection amount: 100 μl
h) Concentration: 0.020 g/10 ml
i) Preparation of the sample: THF in which 0.2% by weight of 2,6-di-tertiary butyl-p-phenol (BHT) is dissolved at room temperature with agitation.
j) Correction: Molecular weight is calculated by correcting the difference between the peak of BHT obtained by the measurement of the calibration curve and the peak of BHT obtained by the measurement of the sample.

Just one kind of said hydrogenated thermoplastic strenic elastomer (E) can be used, or two or more kinds of said hydrogenated thermoplastic strenic elastomer (E), having different weight average molecular weight, or different 1,2-vinylbond content or the like, can be used.

[Softener for Rubber]

As said softener for rubber used in the present invention, a non-aromatic group oil such as paraffinic oil, naphthenic oil, or the like is used, and especially paraffinic oil is a preferable oil in the present invention since said paraffinic oil has good compatibility with said hydrogenated thermoplastic styrenic elastomer used in the present invention.

In the present invention, said softener, having a kinematic viscosity of 50 centistokes (cSt) or higher at 40° C., is used. In a case where the softener having a kinematic viscosity of below 50 centistokes is used, a remarkable amount of gas will come out during the molding of the resulting elastomer composite, making bleeding apt to occur in said elastomer composite.

Further, in a case where a softener having a kinematic viscosity of beyond 500 cSt at 40° C. is used, the resulting molded article will have remarkable stickiness, which will deteriorate the workability of said elastomer composite during molding.

[Olefinic Resin]

The typical olefinic resin used in the present invention is polypropylene. Said polypropylene may include a propylene homopolymer, propylen-ethylene copolymer, modified polypropylene wherein polyethylene, ethylene-propylene copolymer, or the like is added to polypropylene, or the like.

Said olefinic resin plays the role of a binder when said elastomer composite is prepared by mixing, and further gives said elastomer composite heat resistance, proper rigidity, and further gives said elastomer composite fluidity when said elastomer composite is melted for molding.

Said polyolefinic resin having a deflection temperature under load measured in accordance with JIS K 6921-2, in the range of between 80 and 140° C. is preferably used from the view point of the heat resistance of said elastomer composite. Nevertheless, in a case where a polyolefinic resin having a deflection temperature under load of below 80° C., it is feared that deformations will be produced in the resulting molded article.

[Heat Conductive Filler]

As said heat conductive filler combined in said elastomer composite of the present invention, an aluminum hydroxide having a surface covered with an organic coupling agent and/or a magnesium oxide produced by covering an inorganic substance and/or an organic substance on the surface of a magnesia clinker which has been inactivated by the dead burning of a magnesite at a temperature of 1600° C. or higher, is (are) used.

As said aluminum hydroxide, an aluminum hydroxide having a soda component ($Na_2O$) content in said aluminum hydroxide as small as possible (such as an aluminum hydroxide having a soda component content of below 0.4% by mass) is preferably used. An aluminum hydroxide having a small soda component content has a high decomposing temperature, then small moisture absorbency and high insulation properties, so that said aluminum hydroxide having a small soda component content is a preferable material for the present invention.

As said organic coupling agent used for coating said aluminum hydroxide, for instance, a titanic acid ester such as tetra-isopropyl titanate, tetra-butyltitanate, tetra(2-ethyl hexyl)titanate, tetra-stearyl titanate, or the like; and a silicone compound (silan coupling agent) having both a $Si(OR)_3$ part such as γ-methacryloxy-propyl-trimethoxy silane, or the like, and an organic functional group such as vinyl group, amino group, epoxy group, or the like, may be illustrated.

Said coupling agent may include two or more of said organic functional group in a molecule of said coupling agent.

Further, two or more kinds of said coupling agent may be used together.

Said inactive magnesia clinker is prepared by, for instance, the following method.

An alkaline substance such as caustic soda or the like is added to a magnesium containing material such as seawater, bittern, or the like, so as to prepare a magnesium hydroxide slurry.

The resulting magnesium hydroxide slurry is then filtered, and its solid content is collected. Said solid content is then dried by heating at such as 120° C. for 10 hours.

The resulting dried solid content (magnesium hydroxide) is calcined at a temperature in the range of between 600 and 1000° C., so as to prepare a light burned magnesia.

The resulting light burned magnesia is dead burned at a temperature of 1600° C. or higher, preferably in the range of between 1800 and 2100° C. in such as a rotary kiln, or the like, so as to prepare a magnesia clinker.

Since said magnesia clinker having inactive surface is prepared by said burning of said magnesia at a temperature of 1600° C. or higher as described above, said burning treatment is called "dead burning".

During said dead burning, the magnesia component is melted and forms a mass, the resulting magnesia component mass being called a magnesia clinker.

In said calcination, in a case where burning temperature is beyond 1200° C., the activity of the resulting magnesium oxide greatly declines. Further, during said dead burning, the magnesium oxide is inactivated at a burning temperature of 1600° C. or higher, and the resulting inactivated magnesium oxide has no reactivity with acid and water vapor, and forms large-sized crystal.

As aforementioned, since said magnesia clinker is inactivated, and forms large-sized crystal, the resulting magnesia clinker will have an excellent humidity resistance, and heat conductivity.

As said inorganic substance used to cover the surface of said magnesia clinker, aluminum compound, silicon compound and titan compound may be illustrated, and two or more kinds of said inorganic substance may be used together. Said inorganic substance may include, for example, a ceramics group compound such as oxide, nitride, boride, or like, a salt such as nitrate, sulfate, chloride, or the like, hydroxide, or the like.

As said organic substance used to cover the surface of said magnesia clinker, an organic coupling agent the same as used to cover the surface of said aluminum hydroxide, a silane coupling agent, organic synthetic resin, or the like may be illustrated. Two or more kinds of said organic substance may be used together.

By covering the surface of said magnesia clinker with said inorganic substance and/or organic substance, the resulting covered magnesia clinker will have an improved humidity resistance and dispersiveness.

Said heat conductive filler used in the present invention preferably has a water absorption rate of below 1.5% by mass by the humidity resistance test. In a case where said heat conductive filler having a water absorption rate of 1.5% or higher by mass is added to said elastomer composite, both the deterioration of said styrenic elastomer, and the decline of its insulating property are caused.

Said water absorption rate was measured by the humidity resistance test described as follows. Ten grams of a heat conductive filler was put into a Petri dish, and said heat conductive filler containing Petri dish was then kept in a thermostat oven at 90° C. and 90% R.H. for 48 hours. Following this, the change in mass was measured with an electronic balance, said mass change rate (water absorption rate) being calculated using the following formula.

The mass change rate(% by mass)=the mass of the heat conductive filler after test/the mass of the heat conductive filler before test×100.

The new Mohs hardness of said heat conductive filler is preferably below 10. In a case where a heat conductive filler having a new Mohs hardness of below 10 is used, the abrasion caused in the mixing machine and the mold machine can be suppressed.

Herein, the new Mohs hardness is defined as the hardness when the surface of the objective solid sample is successively scratched with 15 kinds of standard mineral, and when the surface of the objective solid sample is damaged by said scratching with a standard mineral, the hardness of the objective solid sample is regarded as the hardness of said standard mineral. A new Mohs hardness of below 10 means that the surface of the objective sample has been damaged by being scratched with garnet.

[Third Components]

Other component(s) can be combined if desired, so far as the advantages of the present invention are not spoiled. A desirable third component in the present invention may be a processing aid to help to improve the extensibility of the melted elastomer composite, by elevating the tensile force of said melted elastomer composite during extrusion molding, injection molding, or the like. Still said processing aid is a desirable third component from the point that said processing aid improves the flame retardancy of said elastomer composite.

A typical processing aid is a modifying agent for polyolefin, said modifying agent being such as acryl modified polytetrafluoroethylene (PTFE), special acrylic resin having a high molecular weight, or the like. In a case where said processing aid is used in said elastomer composite of the present invention, the extensibility and the tensile force of said melted elastomer composite will be improved, so that the melted elastomer composite extends easily, resulting in said melted elastomer composite being hard to snap when a tensile force is effected on said melted elastomer composite.

As a result, any molding inferiority can be avoided since the molded shape is maintained, for example, when the sheet or film is extrusion molded using said elastomer composite.

Other third components may be used in the present invention. Said third components include inorganic fillers such as talc, calcium carbonate, magnesium carbonate, barium sulphate, calcium sulphate, calcium sulfite, calcium phosphate, calcium hydroxide, magnesium hydroxide, aluminum hydroxide, magnesium oxide, titanium oxide, iron oxide, zinc oxide, alumina, silica, diatom earth, dolomite, gypsum, calcined clay, asbestos, mica, calcium silicate, bentonite, white carbon, carbon black, iron powder, aluminum powder, stone powder, blast furnace slag, fly ash, cement, zirconia powder, or the like; organic fillers such as linter, linen, sisal, wood flour, coconut flour, walnut flour, starch, wheat flour, rice flour, or the like; natural fibers such as cotton, hemp, wool or the like; organic synthetic fibers such as polyamide fiber, polyester fiber, acrylic fiber, viscose fiber, acetate fibers or the like; fiber fillers such as asbestos fiber, glass fiber carbon fiber, ceramic fiber, metallic fiber, wisker fiber, or the like; coloring agents such as coloring matter, pigment, carbon black, or the like; various additives such as antistatic agent, electrically conductive bestowal agent, age resister, flame retardant, anti-flaming agent, water-repellent, oil-repellent, insect repellent, antiseptic, wax material, surface-active agent, lubricant, ultraviolet absorber, DBP, DOP, thermostabilizer, chelate agent, dispersive agent, or the like. Further, other polymer(s) may be blended into said elastomer composite so far as the advantages of the present invention are not spoiled.

[Preparation]

Said elastomer composite of the present invention is prepared by mixing 100 parts by mass of said hydrogenated thermoplastic styrenic elastomer (E), 100 to 600 parts by mass of said softener for rubber, 1 to 100 parts by mass of said olefinic resin, so as to prepare a mixture of 100 volume parts, and further 40 to 400 volume parts of said aluminum hydroxide having a surface covered with said organic coupling agent and/or said magnesium oxide being said magnesia clinker having a surface covered with said inorganic substance and/or said organic substance, is (are) added to 100 volume parts of said mixture, wherein said magnesia clinker has been inactivated by the dead burning at a temperature of 1600° C. or higher.

In a case where said softener for rubber is added in an amount of beyond 600 parts by mass to 100 parts by mass of said hydrogenated thermoplastic styrenic elastomer (E) (hereafter to be described as said elastomer), the resulting molded article will have a remarkably sticky surface since said softener will bleed onto the surface of said molded article. On the other hand, in a case where said softener is added in an amount of 100 parts or below by mass for 100 parts by mass of said elastomer, the resulting melted elastomer composite will have poor fluidity, and may be impossible to be molded.

In a case where said olefinic resin is added in an amount of below one part by mass to 100 parts by mass of said elastomer, the binding action of said olefine resin may become insufficient, so that the mixture of the resulting elastomer composite may be hard to bring together during mixing, making the resulting mixture apt to scatter. Accordingly, said mixture of said elastomer composite may be impossible to be molded.

On the other hand, in a case where said olefinic resin is added in an amount of beyond 100 parts by mass to 100 parts by mass of said elastomer, the resulting elastomer composite may lose its elasticity, degrading its adhesiveness to the objective article.

In a case where said heat conductive filler is added in an amount of below 40 volume parts to 100 volume parts of the mixture of said elastomer, said softener for rubber, and said olefinic resin, the resulting elastomer composite will have poor heat conductivity, and on the other hand, in a case where said heat conductive filler is added in an amount of beyond 400 volume parts to 100 volume parts of the mixture, the resulting molded article will become too hard and the elasticity of said molded article may be lost.

Further, in a case where said processing aid is combined, said processing aid is combined in an amount of 200 parts or less by mass to 100 parts by mass of the mixture of said elastomer, said softener for rubber, and said olefinic resin. In a case where said processing aid is combined in an amount of beyond 200 parts by mass of the mixture, the viscosity of the resulting melted elastomer composite may become excessive, in which case, the obstacle may be difficulty in molding.

Said ingredients are mixed together with a mixing machine such as a Banbury mixer, or the like, after which the resulting mixture is commonly melted, and mixed in an extruder, wherein said melted and mixed material is extruded in a strand shape, after which said strand shaped material is then cooled in cold water, and said cooled strand shaped material is then cut with a cutter into pellets.

The pellets thus obtained are then molded commonly by injection molding or extrusion molding, so as to obtain a molded article having a predetermined shape. Alternatively, said mixture of said elastomer composite may be formed into pellets with an extruding machine, or the like, and the resulting pellets may be used as a material for mold processing.

The hardness of said elastomer composite prepared as aforementioned, is preferably to be set below HsA 98. In a case where the hardness of said elastomer composite is beyond HsA 98, the resulting elastomer composite will have poor adhesiveness to the heat source or the cooling part. Further, it is preferable that the heat conductivity of said elastomer composite be 1.0 W/m·K or higher, and that the volume resistivity after the humidity resistance test of said elastomer composite be $1.0 \times 10^{10}$ Ω·cm or higher, and that the molded article of said elastomer composite have no deformation. Further, the flame resistance of said elastomer composite is preferably HB or higher according to UL standard (thickness of the sample: 1.0 mm). In a case where the flame resistance of the elastomer composite is below HB, the resulting elastomer composite will have a quick burning speed, making it hard to say that said elastomer has enough flame resistance. Further, as described above, said elastomer composite should not wear the screw, the mold, or the like during injection molding and extrusion molding.

EXAMPLES and COMPARISONS are provided as follows so as to describe the present invention more concretely.

EXAMPLES 1 TO 25, COMPARISON 1 TO 11

[Material]

Materials described as follows are used.

1. Hydrogenated thermoplastic styrenic elastomer (SEBS)
   (1) G1651H (Trade Name, Maker: Kraton Polymers Japan Ltd.) Styrenic monomer content 33% by mass, Mw: 290,000, 1,2-vinyl bond content: 37% by mass
   (2) G1633 (Trade Name, Maker: Kraton Polymers Japan Ltd.) Styrenic monomer content: 30% by mass, Mw: 450,000, 1,2-vinyl bond content: 37% by mass
   (3) G 1650 (Trade Name, Maker: Kraton Polymers Japan Ltd.) Styrenic monomer content: 29% by mass, Mw: 110,000, 1,2-vinyl bond content: 37% by mass 2. Softener for rubber
   (1) PW 90 (Trade Name, Maker: Idemitsu Petrochemical Co. Ltd.), Kinematic viscosity (40° C.). 84.0 cSt
   (2) PW 380 (Trade Name, Maker: Idemitsu Petrochemical Co. Ltd.) Kinematic viscosity (40° C.): 383.4 cSt 3. Olefinic resin
   (1) PX600A (Trade Name, Maker: SunAllomer Ltd.), Modulus of bending elasticity: 1600 MPa, Melt Index (MI): 5 g/min, Deflection temperature under load: 105° C.
   (2) PH943B (Trade Name, Maker: SunAllomer Ltd.), Modulus of bending elasticity: 470 MPa, MI: 21 g/min, Deflection temperature under load: 60° C.

4. Heat conductive filler
   (1) RF-50-HR (Trade Name, Maker: Ube Material Industries, Ltd.) Magnesia clinker (Dead burning temperature: 1800° C. or higher), Average particle size: 50 μm, The surface of said clinker is covered with silica. Water absorption rate: 0.2%, New Mohs hardness of the cover layer: 7.
   (2) RF-10C-HR (Trade Name, Maker: Ube Material Industries, Ltd.), Magnesia clinker (Dead burning temperature: 1800° C. or higher), Average particle size: 10 μm, The surface of said clinker is covered with silica, Water absorption rate: 0.5%, New Mohs hardness of the cover layer: 7.

(3) BF 083 T (Trade Name, Maker: Nippon Light Metal Co. Ltd.) Aluminum hydroxide, Average particle size: 10 μm, The surface of said aluminum hydroxide is covered with an organic titanate compound, Water absorption rate: 0.2%, Soda component: 0.08%.

(4) BE 033T (Trade Name, Maker: Nippon Light Metal Co. Ltd.), Aluminum hydroxide: Average particle size: 3 μm, The surface of said alumina hydroxide is covered with an organic titanate compound, Water absorption rate: 0.5%, Soda component: 0.02%.

(5) PyroKisma 5301K (5301K) (Trade Name, Maker: Kyowa Chemical Industry Co., Ltd.), Magnesium oxide, Average particle size: 2 μm, The surface of said magnesium oxide is covered with a silan coupling agent. Water absorption rate: 0.4%.

(6) U99NC (Trade Name, Maker: Ube Material Industries, Ltd.), Magnesia clinker the surface of which is burned (Magnesium oxide powder by high temperature treatment), Average particle size: 7 μm, Water absorption rate: 2% or higher.

(7) Pyrolizer HG (HG) (Trade Name, Maker: ISHIZUKA GLASS Co., Ltd.), Aluminum hydroxide, Average particle size: 1.2 μm, The surface of said aluminum hydroxide is covered with ammonium nitrate, Water absorption rate: 2% or higher.

(8) Alunabeads CB-A30S (CB-A30S) (Trade Name, Maker: Showa Denko K. K.), Alumina, Average particle size 28 μm, New Mohs hardness: 12, Water absorption rate: 0.1% or higher.

(9) UC-95H (Trade Name, Maker: Ube Material Industries, Ltd.), Magnesium oxide, Average particle size: 3.3 μm, Water absorption rate: 2% or higher.

5. Processing aid

METABLEN A-3000 (Trade Name, Maker: Mitsubishi Rayon Co., Ltd.), Acryl modified polytetrafluoroethylene (acryl modified-PTFE).

Blend compositions of EXAMPLES 1 to 25 are shown in Tables 1 and 2, and the blend compositions of COMPARISONS 1 to 11 are shown in Table 3.

[Preparation Conditions of Said Elastomer Composite (Base Material)]

The materials, with the exception of the softener for rubber, and the filler, were mixed by dry blending, after which said softener for rubber was impregnated into the resulting mixture. Following this, the resulting mixture into which said softener for rubber was impregnated was then melted and mixed in the extruder under the following conditions, so as to prepare the base material for said elastomer composite.

Extruder: KZW32TW-60MG-NH (Trade Name, Maker: TECHNOVEL CORPORATION).
Cylinder temperature: 180 to 220° C.
Number of rotation of the screw: 300 rpm

[Preparation Conditions of the Heat Conductive Elastomer Composite]

The resulting base materials of said elastomer composites prepared as aforementioned were each put into a Brabender Plastograph, then said base materials of said elastomer composites were melted by heating, after which said fillers were added and mixed therein so as to prepare a heat conductive elastomer composites.

Brabender Plastograph (Trade Name, Maker: Brabender® GmbH & Co. KG)
Temperature in the oven: 160° C.
Number of revolutions of the rotor: 100 rpm
Mixing time: 11 minutes (Molding Conditions of Said Heat Conductive Elastomer Composites)
Injection molding machine: 100 MS 111-10E (Trade Name, Maker: Mitsubishi Heavy Industries Ltd.)
Injection molding temperature: 170° C.
Injection pressure: 30%
Injection time: 10 seconds
Mold temperature: 40° C.

Plate shaped samples, each having a thickness of 2 mm, a width of 125 mm, and a length of 125 mm, and bar shaped samples, each having a thickness of 6 mm, a width of 25 mm, and a length of 125 mm, were prepared under said molding conditions.

[Preparation of Test Pieces to Measure Thermal Conductivity]
Press machine: 40 ton electric oil pressure molding machine.
Heat temperature: upper mold: 195° C., lower mold: 200° C.
Heating time: 2 minutes
Press pressure: 5 MPa
Cooling time: 2 minutes Test pieces to measure heat conductivity, or contact heat resistance, each test piece being plate shaped, and having a thickness of 0.5 mm or 1.0 mm, a width of 200 mm, and a length of 200 mm, were prepared by punching.

[The Methods of Valuations]
Regarding EXAMPLES 1 to 25 and COMPARISONS 1 to 11, valuations on items described as following were performed. The results of the valuation of each property are shown in Tables 1 and 2 regarding EXAMPLES 1 to 25, and Table 3 regarding COMPARISONS 1 to 11.

Measurement of hardness: Using a test piece having a thickness of 6 mm, hardness was measured by a method based on JIS K 6253A.

Heat conductivity: The heat diffusion rate was measured by a laser flash method (Temperature: 19 to 30° C., JIS R 1611).
The specific heat was measured by DSC (based on JIS K 7123).
The specific gravity was measured by an underwater replacement method (based on JIS K 7112).
The heat conductivity was calculated from the results of the aforementioned measurements.

Heat conductivity=Heat diffusion rate×specific heat× specific gravity.

Sample: Disk shaped, Diameter: 10 mm, Thickness: 1.0 mm

Humidity Resistance
Sample (test piece): Prepared by injection molding. Plate shaped, 80.0 mm×80.0 mm×1.0 mm
Method: Each sample (test piece) was kept in a thermostat oven, kept at 80° C.×85% RH for 500 hours, after which the volume resistivity and the deformation of each sample was measured.

The volume resistivity
○: $1.0 \times 10^{10}$ Ω·cm or higher
X: below $1.0 \times 10^{10}$ Ω·cm The deformation
⊚: No deformation was observed.
○: Slight deformation was observed.
Δ: Deformation was observed.
X: Remarkable deformation was observed.

Flame retardancy (UL standard)—measured based on UL standard.

Abrasion test of the screw—Observation by eye after mixing using the Brabender Plastograph.
O: No abrasion
Δ: Slight abrasion
X: Remarkable abrasion

[Necessary Properties]

Hardness: Below HsA98 (Resulting in poor adhesiveness to a heat source in a case where hardness is excessive.)

Heat conductivity: 1.0 W/m·K or higher (In a case where the heat conductivity is low, the heat conductive efficiency deteriorates, so that adequate heat radiation effectiveness can not be guaranteed).

Humidity resistance: The volume resistivity: $1.0 \times 10^{10}$ Ω·cm or higher, and no deformation after the humidity resistance test (Low-volume resistivity means lack of an insulation property).

Flame retardancy: HB or higher based on the UL standard (thickness of sample: 1.0 mm). (In a case where the flame retardancy is below HB, said sample (test piece) will burn quickly, so that it can not be said that said sample (test piece) has enough flame retardancy.)

Screw abrasion: No abrasion of the screw by injection molding, extrusion molding, or the like.

TABLE 1

|  |  | Example 1 | | Example 2 | | Example 3 | | Example 4 | | Example 5 | | Example 6 | | Example 7 | |
| --- | --- | --- | --- | --- | --- | --- | --- | --- | --- | --- | --- | --- | --- | --- | --- |
|  |  | Parts by mass | Mass % | Parts by mass | Mass % | Parts by mass | Mass % | Parts by mass | Mass % | Parts by mass | Mass % | Parts by mass | Mass % | Parts by mass | Mass % |
| SEBS | G1651H | 100 | 41.3 | 100 | 21.6 | 100 | 14.7 | 100 | 41.3 | 100 | 21.6 | 100 | 14.7 | 100 | 41.3 |
|  | G1633 |  |  |  |  |  |  |  |  |  |  |  |  |  |  |
| Softener for rubber | PW90 | 130 | 53.7 | 350 | 75.8 | 570 | 83.6 | 130 | 53.7 | 350 | 75.8 | 570 | 83.6 | 130 | 53.7 |
|  | PW380 |  |  |  |  |  |  |  |  |  |  |  |  |  |  |
| Olefinic resin | PX600A | 12 | 5.0 | 12 | 2.6 | 12 | 1.8 | 12 | 5.0 | 12 | 2.6 | 12 | 1.8 | 12 | 5.0 |
|  | PH943B |  |  |  |  |  |  |  |  |  |  |  |  |  |  |
| Processing aid | METABLEN A3000 |  |  |  |  |  |  |  |  |  |  |  |  |  |  |
| Total of base materials |  | 242 | 100.0 | 462 | 100.0 | 682 | 100.0 | 242 | 100.0 | 462 | 100.0 | 682 | 100.0 | 242 | 100.0 |
| Base materials (volume parts) |  | 100 |  | 100 |  | 100 |  | 100 |  | 100 |  | 100 |  | 100 |  |
| Filler (volume parts) | RF-50-HR | 50 |  | 150 |  | 350 |  |  |  |  |  |  |  |  |  |
|  | RF-10C-HR |  |  |  |  |  |  | 50 |  | 150 |  | 350 |  |  |  |
|  | BF083T |  |  |  |  |  |  |  |  |  |  |  |  |  |  |
|  | BE033T |  |  |  |  |  |  |  |  |  |  |  |  | 100 |  |
| All volume parts |  | 150 |  | 250 |  | 450 |  | 150 |  | 250 |  | 450 |  | 200 |  |
| HsA (point) |  | 42 |  | 79 |  | 87 |  | 41 |  | 81 |  | 87 |  | 42 |  |
| Heat conductivity (W/m · K) |  | 1.1 |  | 2.7 |  | 3.8 |  | 1.0 |  | 2.3 |  | 3.2 |  | 1.0 |  |
| Humidity resistance test (volume resistivity) |  | ○ |  | ○ |  | ○ |  | ○ |  | ○ |  | ○ |  | ○ |  |
| Humidity resistance test (deformation) |  | ◎ |  | ◎ |  | ◎ |  | ◎ |  | ◎ |  | ◎ |  | ◎ |  |
| UL standard |  | HB |  | HB |  | HB |  | HB |  | HB |  | HB |  | V-2 |  |
| Screw abrasion |  | ○ |  | ○ |  | ○ |  | ○ |  | ○ |  | ○ |  | ○ |  |
|  |  | Example 8 | | Example 9 | | Example 10 | | Example 11 | | Example 12 | | Example 13 | | Example 14 | |
|  |  | Parts by mass | Mass % | Parts by mass | Mass % | Parts by mass | Mass % | Parts by mass | Mass % | Parts by mass | Mass % | Parts by mass | Mass % | Parts by mass | Mass % |
| SEBS | G1651H | 100 | 21.6 | 100 | 14.7 | 100 | 21.6 | 100 | 14.7 | 100 | 21.6 | 100 | 21.6 | 100 | 21.6 |
|  | G1633 |  |  |  |  |  |  |  |  |  |  |  |  |  |  |
| Softener for rubber | PW90 | 350 | 75.8 | 570 | 83.6 | 350 | 75.8 | 570 | 83.6 | 350 | 75.8 | 350 | 75.8 | 350 | 75.8 |
|  | PW380 |  |  |  |  |  |  |  |  |  |  |  |  |  |  |
| Olefinic resin | PX600A | 12 | 2.6 | 12 | 1.8 | 12 | 2.6 | 12 | 1.8 | 12 | 2.6 | 12 | 2.6 | 12 | 2.6 |
|  | PH943B |  |  |  |  |  |  |  |  |  |  |  |  |  |  |
| Processing aid | METABLEN A3000 |  |  |  |  |  |  |  |  |  |  |  |  |  |  |
| Total of base materials |  | 462 | 100.0 | 682 | 100.0 | 462 | 100.0 | 682 | 100.0 | 462 | 100.0 | 462 | 100.0 | 462 | 100.0 |
| Base materials (volume parts) |  | 100 |  | 100 |  | 100 |  | 100 |  | 100 |  | 100 |  | 100 |  |
| Filler (volume parts) | RF-50-HR |  |  |  |  |  |  |  |  | 120 |  | 30 |  | 120 |  |
|  | RF-10C-HR |  |  |  |  |  |  |  |  |  |  |  |  |  |  |
|  | BF083T | 150 |  | 350 |  |  |  |  |  | 30 |  | 120 |  |  |  |
|  | BE033T |  |  |  |  | 150 |  | 350 |  |  |  |  |  | 30 |  |
| All volume parts |  | 250 |  | 450 |  | 250 |  | 450 |  | 250 |  | 250 |  | 250 |  |
| HsA (point) |  | 64 |  | 81 |  | 62 |  | 79 |  | 65 |  | 40 |  | 60 |  |
| Heat conductivity (W/m · K) |  | 1.5 |  | 2.8 |  | 1.3 |  | 2.6 |  | 1.9 |  | 1.7 |  | 1.7 |  |
| Humidity resistance test (volume resistivity) |  | ○ |  | ○ |  | ○ |  | ○ |  | ○ |  | ○ |  | ○ |  |
| Humidity resistance test (deformation) |  | ◎ |  | ◎ |  | ◎ |  | ◎ |  | ◎ |  | ◎ |  | ◎ |  |
| UL standard |  | V-0 |  | V-0 |  | V-2 |  | V-0 |  | HB |  | V-0 |  | HB |  |
| Screw abrasion |  | ○ |  | ○ |  | ○ |  | ○ |  | ○ |  | ○ |  | ○ |  |

TABLE 2

|  |  | EXAMPLE 15 | | EXAMPLE 16 | | EXAMPLE 17 | | EXAMPLE 18 | | EXAMPLE 19 | | EXAMPLE 20 | | EXAMPLE 21 | |
| --- | --- | --- | --- | --- | --- | --- | --- | --- | --- | --- | --- | --- | --- | --- | --- |
|  |  | Parts by mass | Mass % | Parts by mass | Mass % | Parts by mass | Mass % | Parts by mass | Mass % | Parts by mass | Mass % | Parts by mass | Mass % | Parts by mass | Mass % |
| SEBS | G1651H | 100 | 21.6 | 100 | 14.7 | 100 | 14.7 | 100 | 14.7 | 100 | 13.3 | 100 | 21.6 |  |  |
|  | G1633 |  |  |  |  |  |  |  |  |  |  |  |  | 100 | 21.6 |
| Softener for rubber | PW90 | 350 | 75.8 | 570 | 83.6 | 570 | 83.6 | 570 | 83.6 | 570 | 76.0 | 350 | 75.8 | 350 | 75.8 |
|  | PW380 |  |  |  |  |  |  |  |  |  |  |  |  |  |  |
| Olefinic resin | PX600A | 12 | 2.6 | 12 | 1.8 | 12 | 1.8 | 12 | 1.8 | 80 | 10.7 |  |  | 12 | 2.6 |
|  | PH943B |  |  |  |  |  |  |  |  |  |  | 12 | 2.6 |  |  |
| Processing aid | METABLEN A3000 |  |  |  |  |  |  |  |  |  |  |  |  |  |  |
| Total of base materials |  | 462 | 100.0 | 682 | 100.0 | 682 | 100.0 | 682 | 100.0 | 750 | 100.0 | 462 | 100.0 | 462 | 100.0 |
| Base materials (volume parts) |  | 100 | | 100 | | 100 | | 100 | | 100 | | 100 | | 100 | |
| Filler (volume parts) | RF-50-HR | 30 |  | 120 |  | 75 |  | 30 |  | 100 |  | 150 |  | 150 |  |
|  | RF-10C-HR |  |  | 30 |  | 75 |  | 120 |  |  |  |  |  |  |  |
|  | BF083T |  |  |  |  |  |  |  |  |  |  |  |  |  |  |
|  | BE033T | 120 |  |  |  |  |  |  |  |  |  |  |  |  |  |
| All volume parts |  | 250 | | 250 | | 250 | | 250 | | 200 | | 250 | | 250 | |
| HsA (point) |  | 38 | | 81 | | 70 | | 79 | | 38 | | 55 | | 71 | |
| Heat conductivity (W/m·K) |  | 1.5 | | 2.4 | | 2.2 | | 2.1 | | 1.5 | | 2.1 | | 2.2 | |
| Humidity resistance test (volume resistivity) |  | ○ | | ○ | | ○ | | ○ | | ○ | | ○ | | ○ | |
| Humidity resistance test (deformation) |  | ◎ | | ◎ | | ◎ | | ◎ | | ◎ | | ◎ | | ◎ | |
| UL standard |  | V-0 | | HB | | HB | | HB | | HB | | HB | | HB | |
| Screw abrasion |  | ○ | | ○ | | ○ | | ○ | | ○ | | ○ | | ○ | |

|  |  | EXAMPLE 22 | | EXAMPLE 23 | | EXAMPLE 24 | | EXAMPLE 25 | |
| --- | --- | --- | --- | --- | --- | --- | --- | --- | --- |
|  |  | Parts by mass | Mass % | Parts by mass | Mass % | Parts by mass | Mass % | Parts by mass | Mass % |
| SEBS | G1651H |  |  |  |  |  |  |  |  |
|  | G1633 | 100 | 21.6 | 100 | 20.7 | 100 | 20.7 | 100 | 16.3 |
| Softener for rubber | PW90 |  |  | 350 | 72.6 | 350 | 72.6 | 350 | 57.2 |
|  | PW380 | 350 | 75.8 |  |  |  |  |  |  |
| Olefinic resin | PX600A | 12 | 2.6 | 12 | 2.5 | 12 | 2.5 | 12 | 2.0 |
|  | PH943B |  |  |  |  |  |  |  |  |
| Processing aid | METABLEN A3000 |  |  | 20 | 4.1 | 20 | 4.1 | 150 | 24.5 |
| Total of base materials |  | 462 | 100.0 | 482 | 100.0 | 482 | 100.0 | 612 | 100.0 |
| Base materials (volume parts) |  | 100 | | 100 | | 100 | | 100 | |
| Filler (volume parts) | RF-50-HR | 150 |  |  |  | 150 |  | 150 |  |
|  | RF-10C-HR |  |  |  |  |  |  |  |  |
|  | BF083T |  |  | 150 |  |  |  |  |  |
|  | BE033T |  |  |  |  |  |  |  |  |
| All volume parts |  | 250 | | 250 | | 250 | | 250 | |
| HsA (point) |  | 71 | | 61 | | 79 | | 82 | |
| Heat conductivity (W/m·K) |  | 2.1 | | 1.5 | | 2.7 | | 2.7 | |
| Humidity resistance test (volume resistivity) |  | ○ | | ○ | | ○ | | ○ | |
| Humidity resistance test (deformation) |  | ◎ | | ◎ | | ◎ | | ◎ | |
| UL standard |  | HB | | V-0 | | HB | | HB | |
| Screw abrasion |  | ○ | | ○ | | ○ | | ○ | |

TABLE 3

|  |  | Comparison 1 | | Comparison 2 | | Comparison 3 | | Comparison 4 | | Comparison 5 | | Comparison 6 | |
| --- | --- | --- | --- | --- | --- | --- | --- | --- | --- | --- | --- | --- | --- |
|  |  | Parts by mass | Mass % | Parts by mass | Mass % | Parts by mass | Mass % | Parts by mass | Mass % | Parts by mass | Mass % | Parts by mass | Mass % |
| SEBS | G1651H | 100 | 21.6 | 100 | 21.6 | 100 | 21.6 | 100 | 21.6 | 100 | 21.6 | 100 | 14.7 |
|  | G1650 |  |  |  |  |  |  |  |  |  |  |  |  |
| Softer for rubber | PW90 | 350 | 75.8 | 350 | 75.8 | 350 | 75.8 | 350 | 75.8 | 350 | 75.8 | 570 | 83.8 |
| Olefinic resin | PX660A | 12 | 2.6 | 12 | 2.6 | 12 | 2.6 | 12 | 2.6 | 12 | 2.6 | 12 | 1.8 |
|  | PH943B |  |  |  |  |  |  |  |  |  |  |  |  |
| Processing aid | METABLEN A3000 |  |  |  |  |  |  |  |  |  |  |  |  |
| Total of base materials |  | 462 | 100.0 | 462 | 100.0 | 462 | 100.0 | 462 | 100.0 | 462 | 100.0 | 682 | 100.0 |

TABLE 3-continued

| | | | | | | | |
|---|---|---|---|---|---|---|---|
| Base materials (volume parts) | | 100 | 100 | 100 | 100 | 100 | 100 |
| Filler (volume parts) | RF-50-HR | | | | | | 450 |
| | BF083T | | | | | | |
| | 5301K | 150 | | | | | |
| | U99NC | | 150 | | | | |
| | HG | | | 150 | | | |
| | CB-A30S | | | | 150 | | |
| | UC-95H | | | | | 150 | |
| All volume parts | | 250 | 250 | 250 | 250 | 250 | 550 |
| HsA (point) | | 51 | 77 | 24 | 30 | 81 | 97 |
| Heat conductivity (W/m·K) | | 1.8 | 2.0 | 1.2 | 1.9 | 1.2 | 4.5 |
| Humidity resistance test (volume resistivity) | | Unmeasurable due to cracking | Unmeasurable due to cracking | Unmeasurable due to cracking | ○ | Unmeasurable due to cracking | ○ |
| Humidity resistance test (deformation) | | X | X | X | ◎ | X | ◎ |
| UL standard | | NG | NG | HB | HB | NG | HB |
| Screw abrasion | | ○ | ○ | ○ | X | ○ | X |

| | | Comparison 7 | | Comparison 8 | | Comparison 9 | | Comparison 10 | | Comparison 11 | |
|---|---|---|---|---|---|---|---|---|---|---|---|
| | | Parts by mass | Mass % | Parts by mass | Mass % | Parts by mass | Mass % | Parts by mass | Mass % | Parts by mass | Mass % |
| SEBS | G1651H | 100 | 21.6 | 100 | 21.6 | 100 | 21.6 | | | 100 | 13.1 |
| | G1650 | | | | | | | 100 | 21.6 | | |
| Softer for rubber | PW90 | 350 | 75.8 | 350 | 75.8 | 350 | 75.8 | 350 | 75.8 | 650 | 85.3 |
| Olefinic resin | PX600A | 12 | 2.6 | 12 | 2.6 | 12 | 2.6 | 12 | 2.6 | | |
| | PH943B | | | | | | | | | 12 | 1.6 |
| Processing aid | METABLEN A3000 | | | | | | | | | | |
| Total of base materials | | 462 | 100.0 | 462 | 100.0 | 462 | 100.0 | 462 | 100.0 | 762 | 100.0 |
| Base materials (volume parts) | | 100 | | 100 | | 100 | | 100 | | 100 | |
| Filler (volume parts) | RF-50-HR | | | | | | | | | | |
| | BF083T | | | 15 | | 225 | | 150 | | 150 | |
| | 5301K | | | 15 | | 225 | | | | | |
| | U99NC | | | | | | | | | | |
| | HG | | | | | | | | | | |
| | CB-A30S | | | | | | | | | | |
| | UC-95H | | | | | | | | | | |
| All volume parts | | 100 | | 130 | | 550 | | 250 | | 250 | |
| HsA (point) | | 7 | | 22 | | 95 | | 60 | | 51 | |
| Heat conductivity (W/m·K) | | 0.1 | | 0.8 | | 3.5 | | 2.1 | | 2.1 | |
| Humidity resistance test (volume resistivity) | | ○ | | ○ | | ○ | | ○ | | ○ | |
| Humidity resistance test (deformation) | | ○ | | ◎ | | ◎ | | X | | ○ | |
| UL standard | | NG | | NG | | V-0 | | HB | | NG | |
| Screw abrasion | | ○ | | ○ | | X | | ○ | | ○ | |

Each sample (test piece) of Examples 1-25, displayed heat conductivity of 1.0 W/m·K or higher, and so an excellent heat conductivity, and a volume resistivity after the humidity resistance test was $1.0 \times 10^{10}$ Ω·cm or higher, and further, each sample displayed no deformation, or slight deformation after the humidity resistance test. Further in the flame retardancy test, each sample displayed an excellent flame retardancy HB or higher, with no wear on the screw. Further, each sample displayed a hardness (HsA) of below 98, showing a preferable adhesiveness. On the other hand, regarding each sample of each COMPARISON, COMPARISON 1, wherein PiroKisma 5301 which is a magnesium oxide not dead burned at 1600° C. or higher and is covered with a silane coupling agent, was used; COMPARISON 2, wherein U99NC, which is a magnesia clinker without a surface cover, was used, COMPARISON 3, wherein Pyrolizer HG, which is an aluminum hydroxide having a surface covered with an inorganic substance (ammonium nitrate), was used, and COMPARISON 5, wherein UC-95H, which is a magnesium oxide without a surface treatment, was used, each example resulted in cracking occurring in each humidity resistance test, so that the volume resistivity of each sample could not be measured.

Further, regarding each sample of each COMPARISON, COMPARISON 4, wherein Alunabeads CB-A30S (New Mohs hardness of 10 or higher (12)), which is an alumina without a surface cover treatment, was used, COMPARISONS 6 and 9, wherein the filler content is beyond 400 volume parts respectively, each sample displayed a remarkable abrasion to the screw, and further, a coloring of the elastomer composite was recognized. It seems that the cause of said coloring of the elastomer composite was due to the mixing of a metal powder produced by the abrasion of the screw in said elastomer composite. Regarding the samples of COMPARISONS 7 and 8, wherein the filler content is below 40 volume parts, the heat conductivity of each sample was below 1.0 W/m·K, and each sample displayed a poor flame retardancy.

Further, in the case of sample of COMPARISON 10, wherein G1650, having a weight average molecular weight of 110,000 (<150,000) was used as an elastomer, said sample displayed a remarkable deformation in the humidity resistance test, and in the case of the sample of COMPARISON 11, wherein the content of said softener for rubber is 650 parts by mass (>600 parts by mass), to 100 parts by mass of said elastomer, said sample displayed an inferior flame retardancy.

POSSIBILITY OF THE INDUSTRIAL UTILIZATION

Said elastomer composite of the present invention has good heat conductivity, and good adhesiveness to the objective substance, and accordingly, said elastomer composite is useful as heat radiating members of electronic parts, making said elastomer composite industrially useful.

The invention claimed is:

1. A heat conductive elastomer composite comprising 100 volume parts of a mixture containing 100 parts by mass of a hydrogenated thermoplastic styrenic elastomer (E), 100 to 600 parts by mass of a softener for rubber having a kinematic viscosity of between 50 and 500 centistokes (cSt) at 40° C., and 1 to 100 parts by mass of an olefinic resin, with 40 to 400 volume parts of a covered magnesium oxide as a heat conductive filler being added thereto, wherein said hydrogenated thermoplastic styrenic elastomer (E) is a hydrogenated product of block copolymer (Z) consisting of block unit(s) (S) of a polymer of styrenic monomer and block unit(s) (B) of a polymer of a conjugative diene compound, said elastomer (E) having a weight-average molecular weight in the range of between 150,000 and 500,000, and a styrenic monomer content in the range of between 20 and 50% by mass, said covered magnesium oxide being a magnesia clinker having a surface covered with an inorganic substance and/or an organic substance, with said magnesia clinker being an inactivated magnesium oxide.

2. A heat conductive elastomer composite in accordance with claim 1, wherein said magnesium oxide being a magnesia clinker covered with an inorganic substance and/or an organic substance have (has) a water-absorption rate by a humidity test of below 1.5% by mass, and a new Mohs hardness of below 10.

3. A heat conductive elastomer composite in accordance with claim 1, wherein the deflection temperature under load of said olefinic resin is in the range of between 80 and 140° C.

4. A heat conductive elastomer composite in accordance with claim 2, wherein the deflection temperature under load of said olefinic resin is in the range of between 80 and 140° C.

* * * * *